US006470556B2

(12) United States Patent
Boe

(10) Patent No.: US 6,470,556 B2
(45) Date of Patent: *Oct. 29, 2002

(54) METHOD REMOVABLY MOUNTING A PLANAR COMPONENT TO A CHASSIS

(75) Inventor: Craig L. Boe, Nampa, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/935,389

(22) Filed: Aug. 22, 2001

(65) Prior Publication Data

US 2001/0052177 A1 Dec. 20, 2001

Related U.S. Application Data

(63) Continuation of application No. 08/988,946, filed on Dec. 11, 1997, now Pat. No. 6,308,394.

(51) Int. Cl.⁷ ............................................... B23P 11/02
(52) U.S. Cl. ..................... 29/450; 24/456; 361/804; 174/138 G
(58) Field of Search ...................... 29/450, 830; 24/454, 24/456, 704.1, 459, 297; 248/500, 222.11; 361/759, 758, 804, 742, 744; 174/138 G, 166 S

(56) References Cited

U.S. PATENT DOCUMENTS

| 3,066,367 A | 12/1962 | Garman ........................ 24/81 |
| 3,777,052 A | 12/1973 | Fegen ..................... 174/138 D |
| 3,996,500 A | 12/1976 | Coules ........................ 248/500 |
| 4,389,759 A | 6/1983 | Yuda ............................ 24/214 |
| 4,495,380 A | * 1/1985 | Ryan et al. ............. 174/138 D |
| 4,627,760 A | 12/1986 | Yagi et al. ..................... 24/297 |
| 4,674,910 A | 6/1987 | Hayashi ........................ 24/297 |
| 4,701,984 A | 10/1987 | Wyckoff ....................... 24/297 |
| 4,855,873 A | 8/1989 | Bhargava et al. ............ 361/424 |
| 4,901,205 A | 2/1990 | Landis et al. ................ 361/242 |
| 4,938,703 A | 7/1990 | Nakano ........................ 439/74 |
| 5,085,589 A | 2/1992 | Kan ............................. 439/92 |
| 5,138,529 A | 8/1992 | Colton et al. ............... 361/424 |
| 5,164,916 A | 11/1992 | Wu et al. ...................... 365/52 |
| 5,191,513 A | 3/1993 | Suguira et al. ............... 24/297 |
| 5,218,760 A | 6/1993 | Colton et al. ................. 29/845 |

(List continued on next page.)

OTHER PUBLICATIONS

Micron Electronics, Inc.—Assignee, U.S. App. S/N 09/472, 728, Filed Dec. 27. 1999. "Method and Apparatus for Biasing a Ciruit Board into Engagement with a Computer Chassis,".

Micron Electronics, Inc.—Assignee, U.S. App. 09/231,306, Filed Jan. 13, 1999, "Ciruit Board Grounding and Supporting Structure Apparatus and Method."

Micron Electronics, Inc.—Assignee, U.S. App. S/N 09/231, 307, Filed Jan. 13, 1999, "Ciruit Board Support Clip."

Primary Examiner—David P. Bryant
Assistant Examiner—Jermie E. Cozart
(74) Attorney, Agent, or Firm—Knobbe Martens Olson & Bear LLP

(57) ABSTRACT

Disclosed is a method of removably mounting a planar electrical component, such as a computer motherboard, to a chassis. The method comprises positioning a first fastener of a mounting device adjacent a mounting slot in the chassis, inserting the first fastener of the mounting device through the mounting slot in the chassis, releasing the mounting device so that the first fastener clamps onto the chassis through the mounting slot, positioning a second fastener of the mounting device adjacent a mounting hole on the planar electrical component, and inserting the second fastener of the mounting device into the mounting hole until the second fastener clamps onto the planar electrical component through the mounting hole.

5 Claims, 3 Drawing Sheets

U.S. PATENT DOCUMENTS

| | | |
|---|---|---|
| 5,225,629 A | 7/1993 | Garrett .................... 174/35 R |
| 5,241,451 A | 8/1993 | Wlaburn et al. ............ 361/785 |
| 5,267,125 A | 11/1993 | Liu ............................ 361/816 |
| 5,452,184 A | 9/1995 | Scholder et al. ........... 361/804 |
| 5,467,254 A | 11/1995 | Brusati et al. .............. 361/799 |
| 5,490,038 A | 2/1996 | Scholder et al. ........... 361/759 |
| 5,513,996 A | 5/1996 | Annerino et al. ............ 439/95 |
| 5,519,169 A | 5/1996 | Garrett et al. ............ 174/35 R |
| 5,537,294 A | 7/1996 | Siwinski ..................... 361/753 |
| 5,563,450 A | 10/1996 | Bader et al. ................ 257/785 |
| 5,647,748 A | 7/1997 | Mills et al. ................... 439/81 |
| 5,689,863 A | 11/1997 | Sinozaki ..................... 24/297 |
| 5,691,504 A | 11/1997 | Sands et al. ............... 174/35 R |
| 5,707,244 A | 1/1998 | Austin ......................... 24/453 |
| 5,754,412 A | 5/1998 | Clavin ........................ 361/804 |
| 5,758,987 A | 6/1998 | Frame et al. .................. 24/297 |
| 5,796,593 A | 8/1998 | Mills et al. .................. 361/801 |
| 5,833,480 A | 11/1998 | Austin ......................... 439/95 |
| 5,865,518 A | 2/1999 | Jarrett et al. ............. 312/223.2 |
| 5,951,307 A | 9/1999 | Klein et al. ................... 439/92 |
| 5,953,217 A | 9/1999 | Klein et al. ................. 361/799 |
| 6,017,246 A | 1/2000 | Hisazumi et al. ........... 439/637 |
| 6,046,912 A | 4/2000 | Leman ....................... 361/784 |
| 6,308,394 B1 * | 10/2001 | Boe ............................. 29/450 |

* cited by examiner

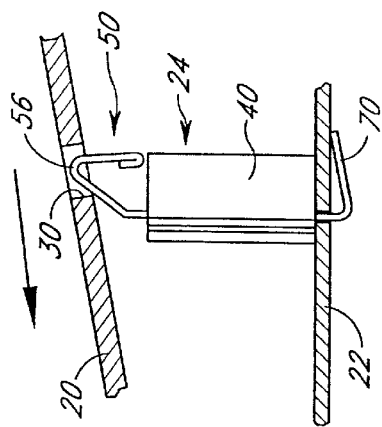
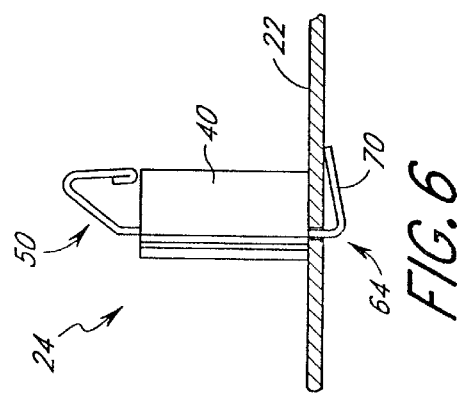
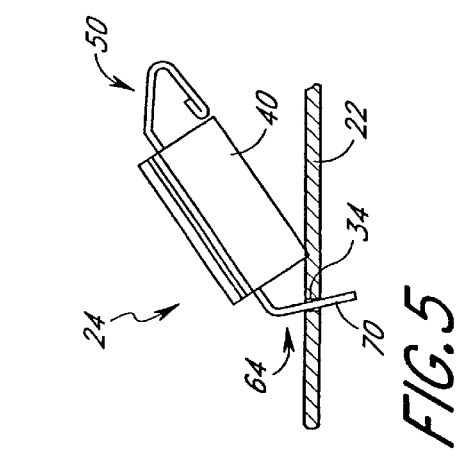
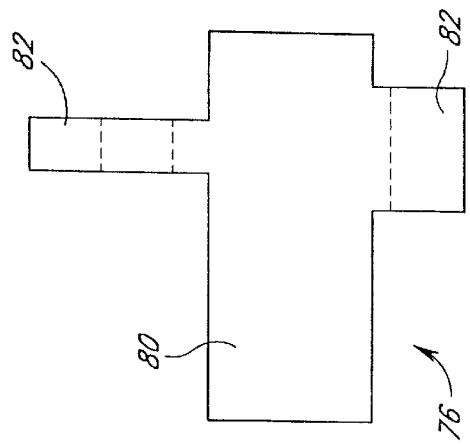
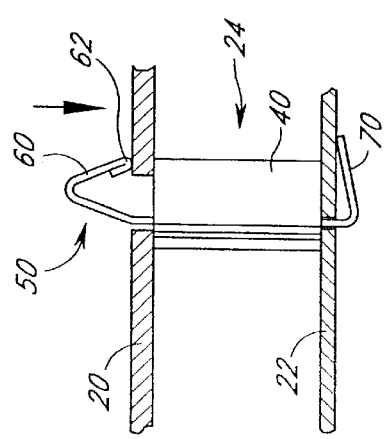
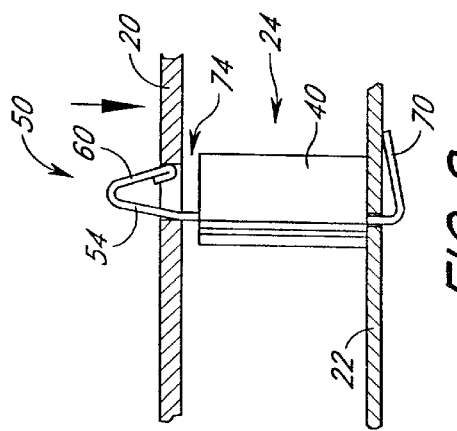

METHOD REMOVABLY MOUNTING A PLANAR COMPONENT TO A CHASSIS

RELATED APPLICATIONS

This application is a continuation of and incorporates by reference in its entirety, U.S. patent application Ser. No. 08/988,946, entitled, "METHOD OF MOUNTING A MOTHERBOARD TO A CHASSIS," filed on Dec. 11, 1997 now U.S. Pat. No. 6,308,394. The subject matter of U.S. patent application Ser. No. 09/935,388, entitled, "METHOD OF MOUNTING A MOTHERBOARD TO A CHASSIS," filed Aug. 22, 2001, and U.S. Pat. 6,124,552 entitled "MOTHERBOARD SCREWLESS MOUNTING SPACER," is related to this application.

BACKGROUND OF THE INVENTION

1. Field of the Invention

The invention relates to mounting spacers for circuit boards. More particularly, the invention relates to a device for easily and quickly mounting a motherboard to a computer chassis.

2. Description of the Related Art

During assembly of a computer, the computer motherboard must be fastened to the computer frame or chassis to secure the board during use against undesired movement relative to the chassis. In existing systems, the motherboard is mounted to the computer chassis using screws or bolts which are typically made of electrically conductive metal. The screws are inserted into any of several mounting holes in the motherboard, which are aligned with corresponding holes on the computer chassis. After insertion of the screws, an installer uses a screwdriver to tighten the screws and thereby securely mount the motherboard to the computer.

The mounting holes on the motherboard are often surrounded by a grounding pad. The grounding pad is a conductive surface that is used as an electrical ground for the motherboard. After mounting, the heads of the metal mounting screws contact the pads on the motherboard and thereby provide an electrical ground interface.

There are certain drawbacks associated with using screws to mount a motherboard to a computer chassis. One such drawback is the great amount of time it takes for an installer to insert the screws through the multiple mounting holes and then tighten each screw onto the motherboard. This process is tedious and time-consuming. It is also time-consuming to remove the screws in order to remove the motherboard from the chassis for purposes such as repairs or maintenance.

There is, therefore, a need for a device that may be used to easily and quickly mount a motherboard to a computer chassis. Preferably, the device should secure the motherboard to the chassis without requiring screws. Additionally, the device preferably should be usable with existing motherboard designs and should also be capable of providing an electrical ground interface for the motherboard.

SUMMARY OF THE INVENTION

The aforementioned needs are satisfied by the present invention. In one aspect of the invention, there is disclosed a method of removably mounting a planar electrical component to a chassis. The method comprises positioning a first fastener of a mounting device adjacent a mounting slot in the chassis, inserting the first fastener of the mounting device through the mounting slot in the chassis, releasing the mounting device so that the first fastener clamps onto the chassis through the mounting slot, positioning a second fastener of the mounting device adjacent a mounting hole on the planar electrical component, and inserting the second fastener of the mounting device into the mounting hole until the second fastener clamps onto the planar electrical component through the mounting hole.

Another aspect of the invention relates to a method of removably mounting a planar electrical component to a chassis. The method comprises inserting a first fastener of a mounting device into a mounting slot in the chassis so that the first fastener compresses the chassis between the first fastener and a spacer portion of the mounting device, and inserting a second fastener of the mounting device into a mounting hole in the planar electrical component so that the second fastener compresses the planar electrical component between the second fastener and the spacer portion.

In another aspect of the invention, there is disclosed a method of removably mounting a planar electrical component to a chassis. The method comprises inserting a first fastener of a mounting device into a mounting hole of the planar electrical component so that the first fastener clamps onto the planar electrical component, and inserting a second fastener of the mounting device into a mounting slot in the chassis so that the second fastener clamps onto the chassis to thereby attach the planar electrical component to the chassis.

In yet another aspect of the invention, there is disclosed a method of removably mounting a planar electrical component to a chassis. The method comprises clamping the chassis between a first fastener and a spacer of a mounting device, and clamping the planar electrical component between a second fastener and the spacer of the mounting device so that the planar electrical component is spaced apart from the chassis by a distance substantially equal to the height of the spacer of the mounting device.

BRIEF DESCRIPTION OF THE DRAWINGS

These and other features of the invention will now be described with respect to the drawings which are intended to illustrate and not to limit the invention and in which:

FIG. 5 is a side view of the mounting spacer illustrating the first step in the process of installing the mounting spacer in a computer chassis;

FIG. 6 is a side view of the mounting spacer illustrating that device after installation onto a chassis;

FIG. 7 is a side view of the mounting spacer illustrating the first step in the process of installing the mounting spacer onto a motherboard;

FIG. 8 is a side view of the mounting spacer illustrating the second step in the process of installing the mounting spacer onto a motherboard;

FIG. 9 is a side view of a motherboard mounted onto a chassis using the mounting spacer of the present invention; and FIG. 10 illustrates a material blank that is formed into the mounting spacer of FIG. 2.

DETAILED DESCRIPTION OF THE INVENTION

Figure 1:
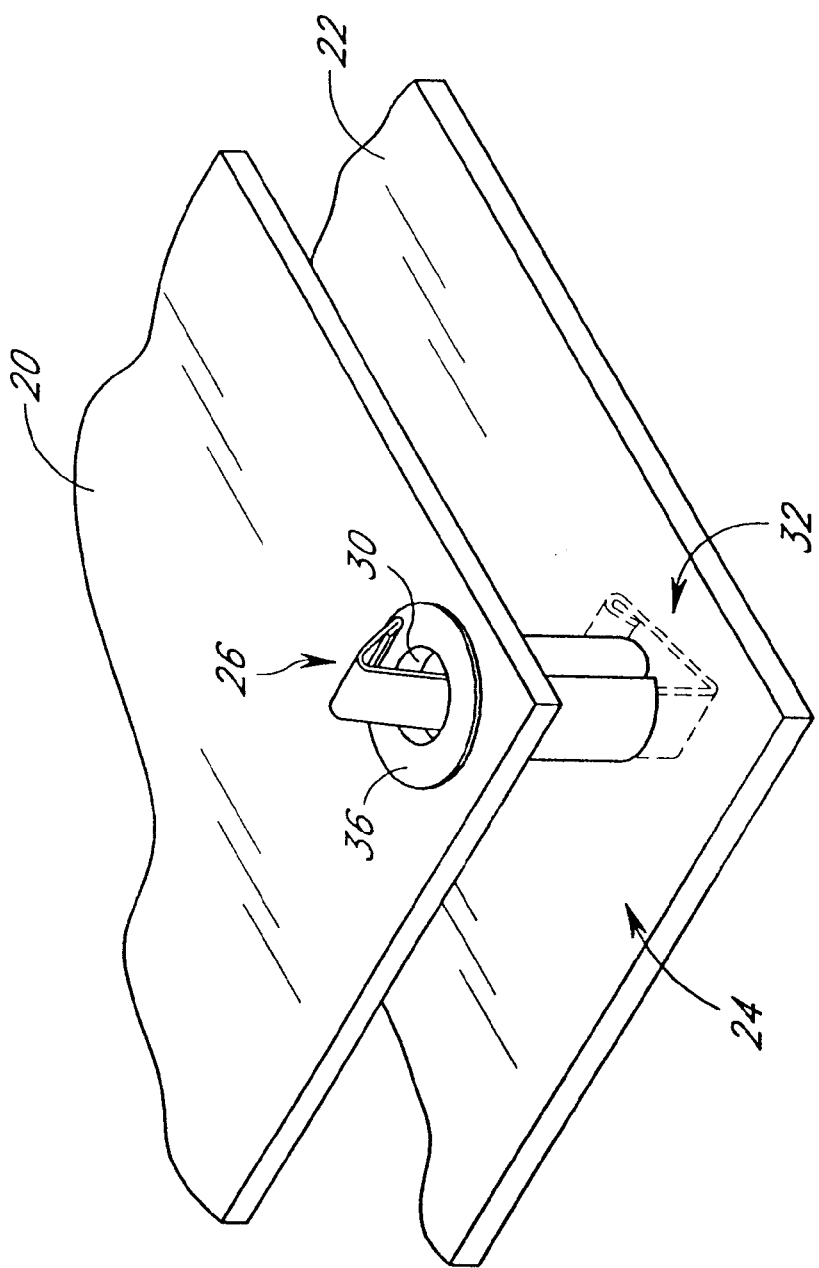
FIG. 1 is a perspective view of a motherboard mounted onto a computer chassis using the mounting spacers of the invention.

FIG. 1 is a perspective view of a planar motherboard 20 mounted onto a frame or chassis 22 of a computer using at least one mounting spacer 24 configured in accordance with one embodiment of the invention. As discussed in detail below, an installer may use the mounting spacers 24 to easily and securely mount the motherboard 20 to the chassis 22 without the use of mounting screws. The motherboard 20 is also easily removed from the chassis 22 and the mounting spacers 24, during repair, upgrade, or maintenance. Although described herein in the context of a motherboard 20 and computer chassis 22, it will be appreciated that the mounting spacer 24 may be used to mount a motherboard 20, or any other planar object, to any of a wide variety of structures having mounting slots.

As shown in FIG. 1, at least one mounting spacer 24 is used to attach the motherboard 20 to the chassis 22. In particular, a top end 26 of the mounting spacer 24 mates or couples with a mounting hole 30 that extends through the motherboard 20. The opposite or bottom end 32 (shown in phantom lines) of the spacer mates or coupled with a corresponding mounting slot 34 (FIG. 5) in the computer chassis 22 so that the motherboard 20 is separated from the chassis 22 by a distance equal to the height of the mounting spacer 24. The mounting holes 30 in the motherboard 20 are arranged so that they may be aligned with the mounting slots 34 on the chassis 22. The motherboard 20 and chassis 22 may be equipped with any number of mounting holes 30 and slots 34, respectively.

As shown in FIG. 1, a grounding pad 36 is positioned around the periphery of each of the mounting holes 30 in the motherboard 20. The top end 26 of the mounting spacer 24 contacts the grounding pad 36. The grounding pad 36 functions as an electrical ground for the motherboard 20 in a manner well known to those skilled in the art. Toward this end, one embodiment of the mounting spacer 24 is manufactured of an electrically-conductive material to provide an electrical ground connection between the mother board 20 and the chassis 22.

Figure 4:
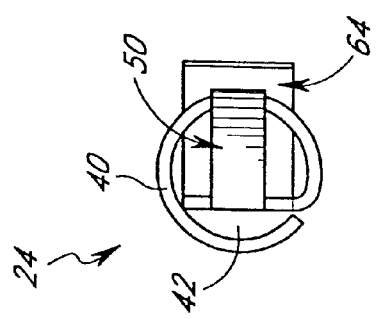
FIG. 4 is a top plan view of the mounting spacer of FIG. 2.
Figure 3:
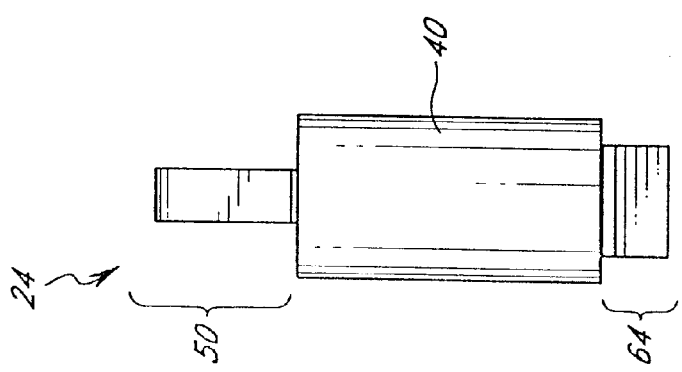
FIG. 3 is a front elevational view of the mounting spacer of FIG. 2.
Figure 2:
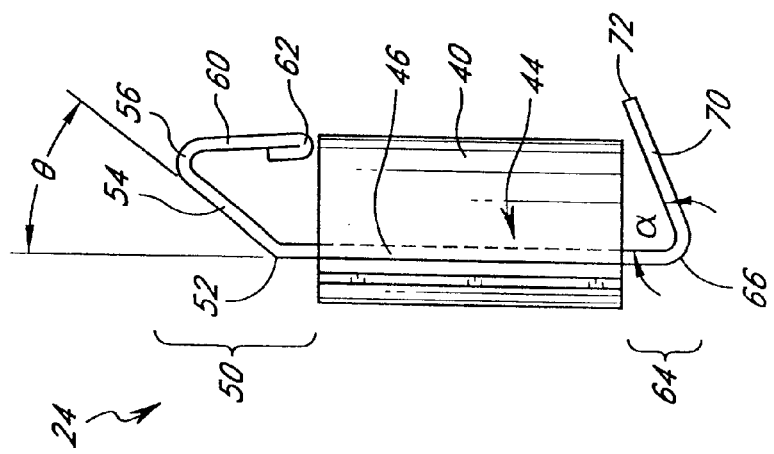
FIG. 2 is a side elevational view of one embodiment of the mounting spacer of the invention.

FIGS. 2, 3, and 4 are side, front, and top views, respectively, of one embodiment of the mounting spacer 24 of the invention. As shown, the mounting spacer 24 includes a spacer portion 40 comprising a wall that defines a substantially cylindrical shape and defines a hollow space 42 (FIG. 4) therein. The height and diameter of the spacer portion 40 may be varied to provide various spacing distances between the motherboard 20 and chassis 22.

As best shown in FIG. 2, the mounting spacer 24 further comprises a thin and elongated clip member 44 having a central portion 46 (shown in phantom) that extends through the hollow space 42 within the spacer portion 40. In the illustrated embodiment, the central portion 46 extends substantially parallel to the axis of the spacer portion 40 and is aligned slightly offset from the center axis of the spacer portion 40. As shown in FIG. 4, one end of the spacer portion 40 curves or coils into the hollow space 42 and integrally forms into the central portion 46 of the clip member. The coiled configuration reduces the likelihood of the mounting spacer 24 twisting during use.

With reference to FIG. 2, the clip member 44 further includes an upper clamp or fastener 50 that extends upward from the upper edge of the central portion 46 so as to protrude from the top of the spacer portion 40. The upper fastener 50 is configured to removably clamp the mounting spacer 24 to the motherboard 20, as described more fully below.

As best shown in FIG. 2, the upper fastener 50 includes a first bend 52 which defines a first arm 54 of the upper fastener 50 that is oriented at an angle θ relative to the central portion 46. The upper fastener 50 further includes a second bend 56 that defines a second arm 60 that extends downwardly toward the spacer portion 40 substantially parallel to the central portion 46. The second arm 60 has a lower tip 62 that is positioned flush against the peripheral upper edge of the spacer portion 40. In one embodiment, the upper fastener 50 is biased or spring loaded so that the lower tip 62 of the second arm 60 is urged to press against the upper edge of the spacer portion 40. In the illustrated embodiment, the second arm 60 is also bent at the lower tip 62 to provide the lower tip 62 with a rounded edge.

As shown in FIG. 2, the clip member 44 further includes a lower clamp or fastener 64 that extends downwardly from the bottom edge of the central portion 46. The lower fastener 64 is configured to removably clamp the mounting spacer 24 to the computer chassis 22, as described more fully below. The lower fastener 64 includes a first bend 66 which forms a first arm 70 that terminates at a tip 72 extending beyond the periphery of the spacer portion 40. The first arm 70 of the lower fastener 64 is oriented at an angle α relative to the central portion 46. The first arm 70 is biased or spring loaded toward the spacer portion 40. Thus, when the first arm 70 is pulled away from the spacer portion 40, it automatically springs back toward the spacer portion 40 and assumes its natural orientation, as shown in FIG. 2.

As shown in FIG. 3, the width of the upper fastener 50 is slightly less than the width of the lower fastener 64. However, it will be appreciated that the sizes of the upper and lower fasteners 50 and 64, respectively, may be varied to fit within various mounting holes 30 and mounting slots 34 in a motherboard 20 and in a computer chassis 22. In one embodiment, the mounting slots 34 slots have dimensions of 0.03"×0.19".

Exemplary dimensions of one embodiment of the mounting spacer 24 are as follows. The width of the lower fastener 64 is approximately 0.17 inches and the width of the upper fastener 50 is approximately 0.08 inches. Referring to FIG. 2, the first bend 52 of the upper fastener 50 is spaced approximately 0.07 inches from the upper edge of the spacer portion 40. The angle θ of the first arm 54 of the upper fastener 50 is approximately 42°. Additionally, the length of the first arm 54 of the upper fastener 50 is approximately 0.22 inches and the length of the second arm 56 of the upper fastener 50 is approximately 0.20 inches.

Regarding the lower fastener 64, the angle a is approximately 68°. The first bend 66 in the lower fastener 64 is spaced approximately 0.10 inches from the lower edge of the spacer portion 40. The length of the first arm 70 of the lower fastener 64 is approximately 0.26 inches. The foregoing dimensions have been found to provide secure fastening characteristics when the mounting spacer 24 is attached to a computer chassis 22 and motherboard 20. However, it will be appreciated that the foregoing dimensions are merely exemplary and that the dimensions of the mounting spacer 24 may be varied based upon the circumstances.

FIGS. 5–9 illustrate the manner in which the mounting spacer 24 is used to mount the motherboard 20 to the chassis 22. As shown in FIG. 5, an installer first pulls the first arm 70 of the lower fastener 64 away from the spacer portion 40 and then inserts the first arm 70 of the lower fastener 64 through the mounting slot 34 in the chassis 22. As shown, the mounting spacer 24 is positioned at an angle relative to the plane of the chassis 22.

As shown in FIG. 6, the bias in the first arm 70 forces the mounting spacer 24 to pivot such that it orients substantially vertical relative to the chassis 22. In this position, the chassis 22 is compressed between the lower fastener 64 and the lower edge of the spacer portion 40. The mounting spacer 24 is thus secured to the chassis 22 via the lower fastener 64. It will be appreciated that an installer may easily remove the mounting spacer 24 from the chassis 22 by pulling the lower fastener 64 out of the mounting slot 34 in the chassis 22.

As shown in FIG. 7, the installer may then mount the motherboard 20 to the mounting spacer 24. The installer first inserts the second bend 56 of the upper fastener 50 into the mounting hole 30 of the motherboard 20. As shown in FIG. 8, the installer then presses the motherboard 20 downward onto the mounting spacer 24 so that the first and second arms 54 and 60 of the upper fastener 50 are compressed toward each other. When so pressed, the first and second arms 54 and 60 are oriented such that the lower tip 62 of the second arm 60 rises relative to the spacer portion 40, thereby creating a gap 74 between the lower tip 62 of the second arm 60 and the upper edge of the spacer portion 40.

As shown in FIG. 9, the installer then continues to push the motherboard 20 downward until the lower tip 62 of the second arm 60 exits the mounting hole 30. At this point the second arm 60 springs to its natural orientation and the motherboard 20 is positioned within the gap 74. The motherboard 20 is thus compressed between the lower tip 62 of the upper fastener 50 and the mounting spacer 24. In this manner, the mounting spacer 24 securely retains the motherboard 20 in connection with the computer chassis 22. The motherboard 20 may be easily and quickly removed by reversing the previously-described steps.

FIG. 10 shows a flat material blank 76 that may be used to form the mounting spacer 24. The material blank 76 includes a main section 80 and two protrusions 82. Prior to use, the main section 80 is rolled into the shape of a cylinder to form the spacer portion 40 of the mounting spacer 24. The protrusions 82 are then folded at the broken fold lines to form the upper and lower fasteners 50 and 64. The mounting spacer 24 is preferably manufactured of an electrically-conductive material so that the mounting spacer 24 may be used as an electrical ground.

The mounting spacer 24 may thus be used to easily and securely mount a motherboard 20 to a computer chassis 22. The mounting spacer 24 eliminates the need for screws and also provides an electrical ground interface for the motherboard 20. It will be appreciated that the mounting spacer 24 may be used with an existing motherboard and computer chassis without the need for modifications to the motherboard or chassis.

Hence, although the foregoing description of the invention has shown, described, and pointed out fundamental novel features of the invention, it will be understood that various omissions, substitutions, and changes in the form of the detail of the apparatus and method as illustrated as well as the uses thereof, may be made by those skilled in the art without departing from the spirit of the invention. Consequently, the scope of the invention should not be limited to the foregoing discussion, but should be defined by the appended claims.

What is claimed is:

1. A method of removably mounting a planar component to a chassis, comprising the acts of:

positioning a first fastener of a mounting device adjacent a mounting slot in the chassis;

inserting an arm of the first fastener of the mounting device through the mounting slot in the chassis;

releasing the arm so that the arm compresses the chassis between the arm and a spacer portion of the mounting device, said spacer portion comprising a sheet of material which is bent so as to not lie in a single plane and so as to define a continuous supporting surface, at least a portion of which directly contacts the chassis;

positioning a second fastener of the mounting device adjacent a mounting hole on the planar component, said second fastener having first and second mounting arm portions;

inserting the first and second arm portions into the mounting hole so that at least one of the arm portions is compressed toward the other arm portion until the second arm portion passes out of the mounting hole; and, applying force from the second arm portion onto the planar component so as to urge the planar component into contact with the spacer portion of the mounting device, the spacer portion being located on a different side of the planar component than the second arm portion.

2. The method of claim 1, wherein the spacer portion defines a cylindrical configuration.

3. The method of claim 1, wherein the act of inserting the first and second arm portions comprises inserting the first and second arm portions through the mounting hole until the second arm portion of the second fastener springs out of the mounting hole and compresses the planar component between the second arm portion and the spacer portion.

4. The method of claim 1, wherein the act of applying force comprises urging the planar component into contact with portions of the spacer portion that are located so as to define a perimeter that encloses the mounting hole.

5. The method of claim 1, wherein the act of applying force comprises urging the planar component into contact with the spacer portion which is configured such that a face of the spacer portion is oriented substantially orthogonal to the planar component.

* * * * *